US012562540B1

(12) United States Patent

Taylor et al.

(10) Patent No.: US 12,562,540 B1

(45) Date of Patent: Feb. 24, 2026

(54) POWER SUPPLY DOCKING STATION WITH INTERNAL BATTERY POWER

(71) Applicant: Perkins Technical Services, Inc., Huntsville, AL (US)

(72) Inventors: Jeffrey Keith Taylor, Huntsville, AL (US); Frank N. Perkins, III, Huntsville, AL (US); Jason Scott Mayfield, Huntsville, AL (US)

(73) Assignee: Perkins Technical Services, Inc., Huntsville, AL (US)

( * ) Notice: Subject to any disclaimer, the term of this patent is extended or adjusted under 35 U.S.C. 154(b) by 132 days.

(21) Appl. No.: 18/416,217

(22) Filed: Jan. 18, 2024

Related U.S. Application Data

(63) Continuation of application No. 17/346,878, filed on Jun. 14, 2021, now Pat. No. 11,888,273.

(60) Provisional application No. 63/038,495, filed on Jun. 12, 2020.

(51) Int. Cl.
| | |
|---|---|
| *H02J 7/00* | (2006.01) |
| *H01R 33/94* | (2006.01) |
| *H01R 33/945* | (2006.01) |
| *H05K 5/03* | (2006.01) |

(52) U.S. Cl.
CPC ........... *H01R 33/94* (2013.01); *H01R 33/945* (2013.01); *H02J 7/0042* (2013.01); *H05K 5/03* (2013.01); *H01R 2201/24* (2013.01)

(58) Field of Classification Search
CPC .. H01R 33/94; H01R 33/945; H01R 2201/24; H02J 7/0042; H05K 5/03
See application file for complete search history.

(56) References Cited

U.S. PATENT DOCUMENTS

| | | | | |
|---|---|---|---|---|
| 6,041,243 A | * | 3/2000 | Davidson ............... | H04B 1/385 |
| | | | | 455/575.1 |
| 2007/0299659 A1 | * | 12/2007 | Chamberlain ........ | G10L 19/173 |
| | | | | 704/219 |
| 2013/0231779 A1 | * | 9/2013 | Purkayastha .......... | B25J 9/1697 |
| | | | | 700/258 |

* cited by examiner

*Primary Examiner* — Michael C Zarroli

(74) *Attorney, Agent, or Firm* — Bradley Arant Boult Cummings LLP; Ryan J. Letson; Alex H. Huffstutter

(57) ABSTRACT

A power supply docking station for a Harris AN/PRC-150 (C) radio has a housing configured to support and provide DC power to the radio. The housing has an integrated battery compartment for receiving at least two military standard BB-2590 batteries. Each battery can independently power the radio, such that the other battery can be swapped out while the radio is in use.

15 Claims, 3 Drawing Sheets

POWER SUPPLY DOCKING STATION WITH INTERNAL BATTERY POWER

REFERENCE TO RELATED APPLICATIONS

This application is a continuation of U.S. Non-Provisional patent application Ser. No. 17/346,878, titled "Power Supply Docking Station with Internal Battery Power," filed Jun. 14, 2021, which claims priority to U.S. Provisional Application No. 63/038,495, filed Jun. 12, 2020. Both applications are incorporated herein by reference.

BACKGROUND AND SUMMARY

As expeditionary missions for military operations become the norm, it is important to continually examine how military forces are equipped to deploy tactical radios. The primary tactical radios used by Brigade Combat Team (BCT) ground forces include: SINCGARS ASIP (VHF), PRC-117G, PRC-160, PRC-158 and other military radios for Special Operations. BCTs need to be trained and proficient in deployment and operation of their currently-fielded tactical radios. Regardless of military occupational specialty, Soldiers must be able to quickly deploy their radios for conduct of operations. This is especially important in expeditionary environments characterized by remote dispersion of forces and fast-moving operations.

The current method of installing tactical radios for fixed Command Post Operations, operations in vehicles, and operations conducted by dismounted foot soldiers are different and provide different levels of capability. Having three different methods of deploying the same tactical radio is inefficient. In some cases, soldiers use the same tactical radio installation kits and mounts designed for vehicles (weighing over 100 pounds) in the mid-1990s to set up communications on a table inside a CP but then require an external Power Supply (weighing in at over 40 pounds) to power this system. As a result of PTS's earlier development of a tactical radio Power Supply Docking Station (PSDS), many users have purchased the PTS PSDS (weighing approximately 20 pounds and includes the aforementioned power supply) to conduct expeditionary missions. The PTS PSDS offers significantly reduced weight, bulk, and complexity while improving reliability.

Based on PTS's experience developing the current suite of Power Supply Docking Stations, PTS saw a path to standardize radio operations in fixed command posts, in vehicles, and for dismounted Soldiers. The standardization of radio operations involves expanding the capabilities of the PSDS to provide all soldiers an enhanced power feature of embedding military batteries into the chassis of the PSDS, enabling the new PSDS to be installed in a vehicle. The PSDS installed in the vehicle can then be removed from a vehicle and used in a fixed Command Posts, or by dismounted soldiers conducting remote expeditionary operations. The internal battery bank of the PSDS holds two military standard BB-2590 batteries. These batteries can be swapped out without interrupting radio operations. We refer to this as hot swapping of the batteries. There is no need to turn the radio off when moving from one power source to another. This invention is revolutionary because it can be used by soldiers in all three scenarios without modification. The addition of internal batteries in the PSDS also supports the use of radio power amplifiers which expands the range of communications. This added capability is embedded in a small lightweight, water resistant, reliable package. Currently dismounted soldiers have no way to enjoy the advantages of using the power amplifier for their radios in a single system that could always be available to the user. Initial deployment and installation of a communication system can be accomplished without the necessity of an external power system. The soldier will have a self-contained unit providing radio, long range amplifier, and power source, all carried in one hand to the communication site. This site can run for hours or days with only the swapping of a few batteries, while never losing communication. This has advantages in rapid deploy as well as silent running operations.

In the vehicle the upgraded PSDS can be plugged into the 28 VDC vehicle power; in the CP the PSDS can be mounted into a CP rack which would take either 28 VDC power from an external 28 VDC source, or the PSDS CP rack that would provide the 28 VDC power. For the dismounted foot solider the PSDS would operate on the internal battery bank. With the system according to the present disclosure the user now has the ability to mount two different military radios in a small space inside of the vehicle in a space that currently only will accommodate one or two radios of the same type. This offers vehicle-mounted troops a significant advantage over the current system. In the CP the soldiers would be able to select different radios with significantly reduced footprint again a significant advantage. These operational advantages are an evolutionary improvement to current military communications operations.

Unique capabilities of this new system include the following: Small footprint, lightweight, radio can always be powered on, power amplifier power always available, water resistant, modular, external power available via the standard NATO power connector, common vehicle mounting system across all military radios, hot swappable batteries without interrupting radio operations, and very easy to use with minimal impact on training.

DETAILED DESCRIPTION

Figure 1:
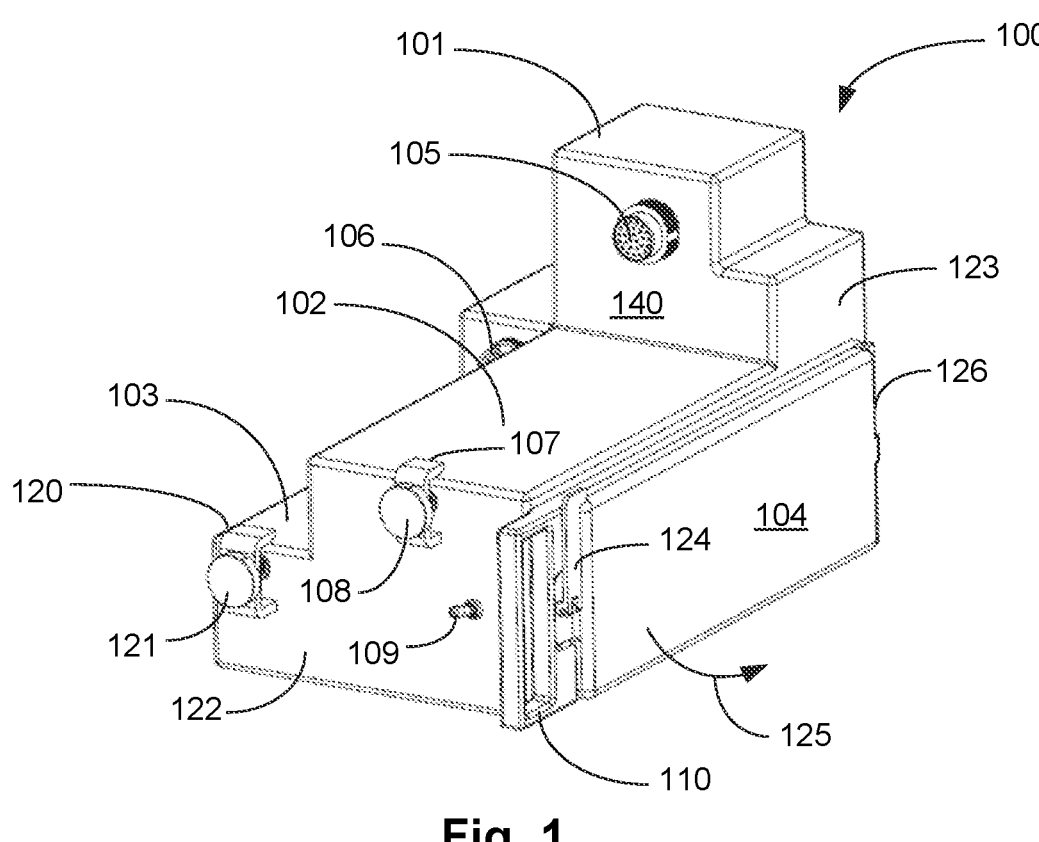
FIG. 1 is a front perspective view of a PSDS configured to support a SINCGARS RT-1523 radio according to an exemplary embodiment of the present disclosure.

FIG. 1 is a front perspective view of an embodiment of a power supply docking station (PSDS) 100 configured to support a SINCGARS RT-1523 radio (not shown). The PSDS comprises a housing 101 that comprises an upper support platform 102 and a lower support platform 103. The upper support platform 102 is configured to receive the radio. A radio connector 105 connects to the radio when it is installed on the upper support platform 102 to provide power to the radio. A back support portion 140 of the housing 101 provides a back stop against which the radio rests when it is installed on the PSDS. The connector 105 is disposed on the back support portion 140 of the housing 101. A clamp 107 affixed to the housing 101 via a thumb screw 108 is operable to affix the radio to the upper support platform 102.

The lower support platform 103 is configured to receive a radio frequency power amplifier (RFPA) (not shown). An RFPA connector 106 connects to the RFPA when it is installed on the lower support platform 103 to provide power to the RFPA. A clamp 120 affixed to the housing 101 via a thumb screw 121 is operable to affix the RFPA to the upper support platform 103. A power switch 109 is disposed on a front side 122 of the housing 101. Actuating the power switch 109 powers the PSDS 100.

A battery compartment cover 104 on a right side 123 of the housing 101 covers a battery compartment (not shown) that is disposed within the housing 101. The battery compartment cover 104 comprises a handle 110 on its frontward end that extends beyond the front side 122 of the housing 101. A latch 124 on the battery compartment cover 104 actuates to secure the battery compartment cover 104 closed, and to allow the battery compartment cover 104 to be opened. The battery compartment cover 104 swings open in the direction indicated by directional arrow 125 to expose the batteries (not shown) within the battery compartment. In this regard, hinges (not shown) are disposed on a rearward end 126 of the battery compartment cover 104.

Figure 2:
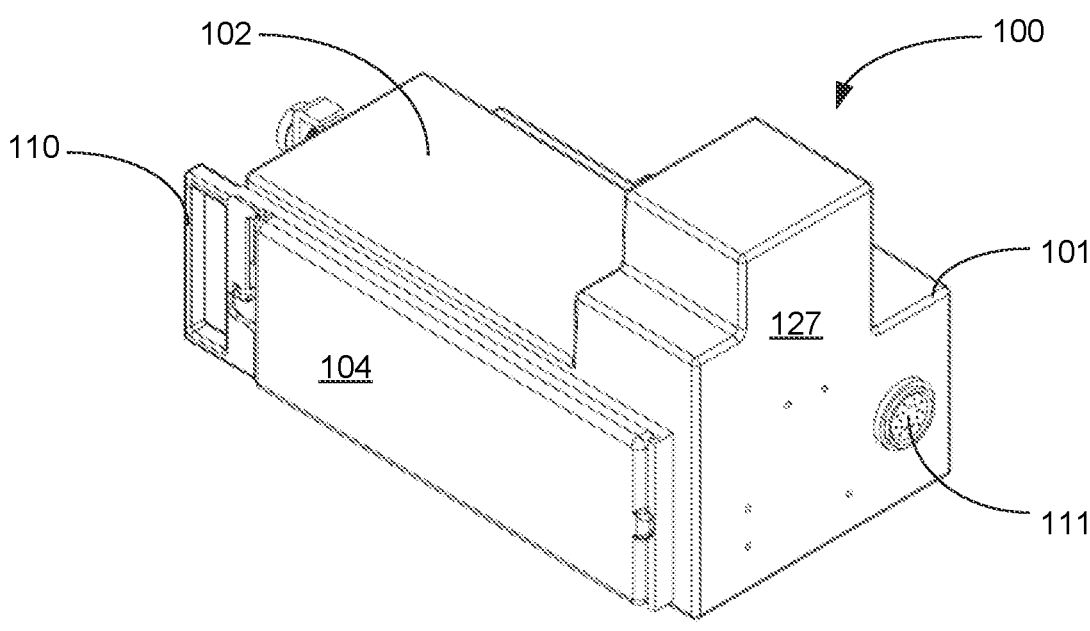
FIG. 2 is a rear perspective view of the PSDS of FIG. 1.

FIG. 2 is a rear perspective view of the PSDS 100 of FIG. 1. An auxiliary power connector 111 is disposed on a rear side 127 of the housing 101. The auxiliary power connector can be used to connect the PSDS to an external DC power source, such as a car battery.

Figure 3:
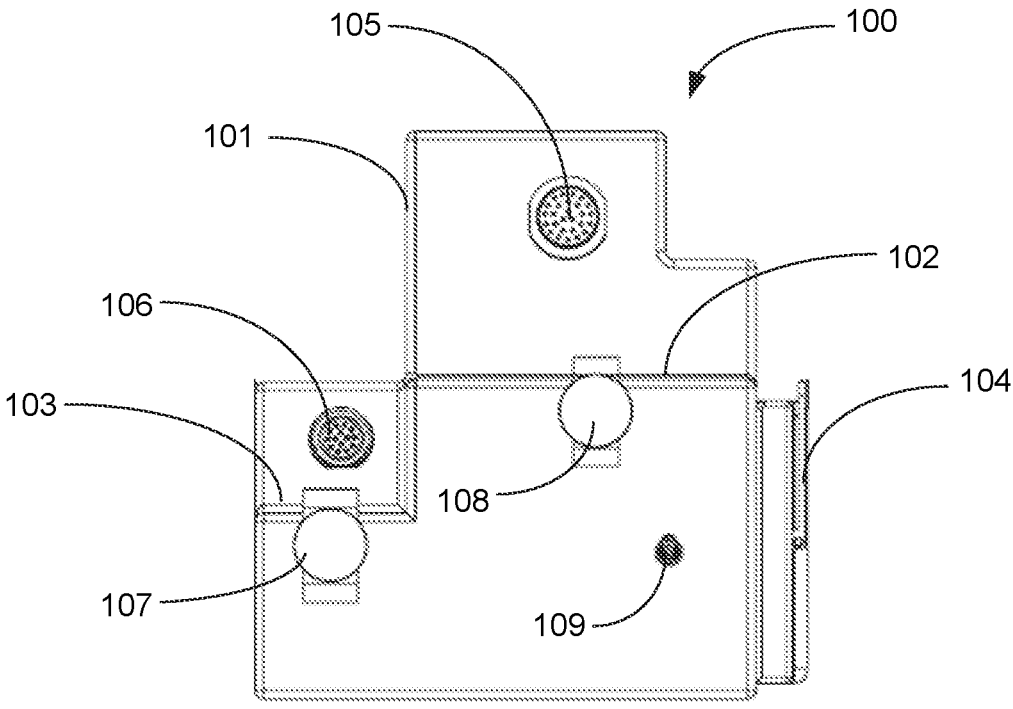
FIG. 3 is a front plan view of the PSDS of FIG. 1.

FIG. 3 is a front plan view of the PSDS 100 of FIG. 1. The upper support platform 102 is higher than the lower support platform 103 as shown. The upper support platform 102 and the lower support platform 103 are both substantially flat and substantially horizontal. The back support portion 140 of the housing 101 extends vertically from the lower support platform 102, perpendicularly from the lower support platform 102.

A bottom side 130 of the housing 101 is substantially flat and substantially horizontal in the illustrated embodiment, ideally for sitting on a flat surface.

Figure 4:
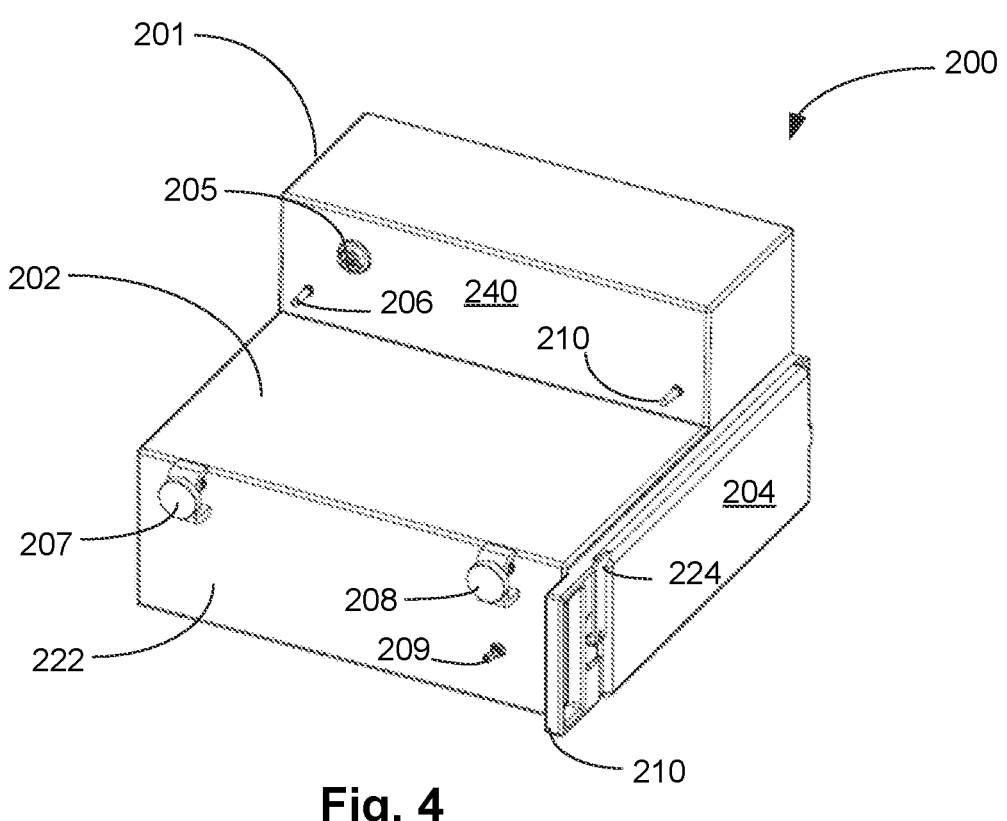
FIG. 4 is a front perspective view of a PSDS configured to support a AN/PRC-150(C) radio according to an exemplary embodiment of the present disclosure.

FIG. 4 is a front perspective view of a PSDS 200 according to another embodiment of the present disclosure. In this embodiment, the PSDS 200 is configured to receive, support and provide power to a Harris AN/PRC-150(C) radio (not shown). The PSDS 200 comprises a housing 201 that comprises a support platform 202. The support platform 202 is configured to receive the radio. A radio connector 205 connects to the radio when it is installed on the support platform 202 to provide power to the radio. Clamps 207 and 208 affixed to the housing 101 via thumb screws 220 and 221 are operable to affix the radio to the support platform 202.

Guide pins 206 and 210 serve to align the radio with the support platform 202 for connection of the radio to the PSDS 200. In this regard, the radio (not shown) comprises openings for receiving the guide pins when the radio and PSDS are in proper alignment. A back support portion 240 of the housing 201 provides a back stop against which the radio rests when it is installed on the PSDS. The connector 205 is disposed on the back support portion 240 of the housing 201. A power switch 209 is disposed on a front side 222 of the housing 101. Actuating the power switch 209 powers the PSDS 200.

A battery compartment cover 204 on a right side 223 of the housing 201 covers a battery compartment (not shown) that is disposed within the housing 201. The battery compartment cover 204 comprises a handle 210 on its frontward end that extends beyond the front side 222 of the housing 201. A latch 224 on the battery compartment cover 204 actuates to secure the battery compartment cover 204 closed, and to allow the battery compartment cover 204 to be opened. The battery compartment cover 204 swings open in the same manner discussed above with respect to the PSDS 100 of FIG. 1.

Figure 5:
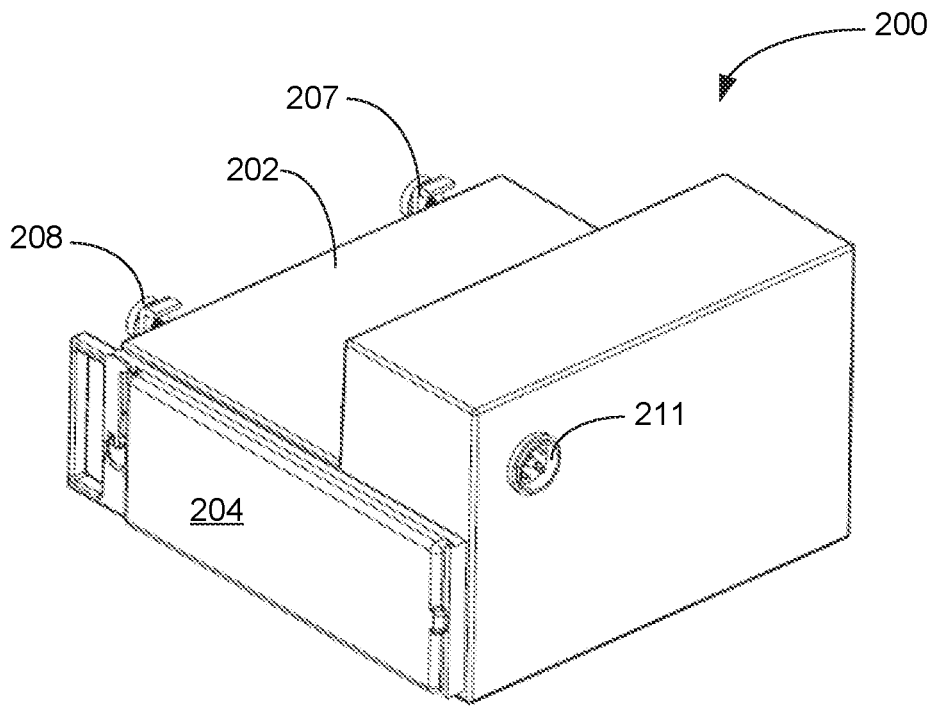
FIG. 5 is a rear perspective view of the PSDS of FIG. 4.

FIG. 5 is a rear perspective view of the PSDS 200 of FIG. 4. An auxiliary power connector 211 is disposed on a rear side 127 of the housing 101. The auxiliary power connector can be used to connect the PSDS to an external DC power source, such as a car battery.

In another embodiment of the present disclosure, the PSDS (not shown) supports a Harris AN/PRC-160(V) radio. This unpictured embodiment is substantially similar to that shown in FIGS. 5 and 6, only with different dimensions.

What is claimed is:

1. A power supply docking station for a radio comprising:
   a housing configured to support and provide power to the radio, the housing further comprising an auxiliary power connector configured to connect to an external DC power source;
   a radio connector affixed to the housing, the radio connector configured for electrically connecting with the radio; and
   a battery compartment within the housing, the battery compartment configured to receive and retain at least two military standard batteries, each battery electrically connected to the connector, each battery configured to independently power the radio.

2. The power supply docking station of claim 1, wherein the at least two military standard batteries are BB-2590 batteries.

3. The power supply docking station of claim 1, the auxiliary power connector disposed on a rear side of the housing.

4. The power supply docking station of claim 1, further comprising a substantially flat support platform configured to receive and support the radio.

5. The power supply docking station of claim 1, the housing further comprising a battery compartment cover configured to swing open to allow access to the batteries.

6. The power supply docking station of claim 5, the battery compartment cover comprising a handle on its frontward end, the handle extending beyond a front side of the housing.

7. The power supply docking station of claim 6, the battery compartment cover further comprising a latch actuatable to secure the battery compartment cover closed.

8. The power supply docking station of claim 7, further comprising hinges disposed on a rearward end of the battery compartment cover, the hinges rotatably connecting the battery compartment cover to the housing.

9. A power supply docking station for a radio comprising:
   a housing configured to support and provide power to the radio;
   a radio connector affixed to the housing, the radio connector configured for electrically connecting with the radio; and
   a battery compartment within the housing, the battery compartment configured to receive and retain at least two military standard batteries, each battery electrically connected to the connector, each battery configured to independently power the radio,
   wherein the housing further comprises a battery compartment cover configured to swing open to allow access to the batteries,
   wherein the battery compartment cover comprises a handle on its frontward end, the handle extending beyond a front side of the housing.

10. The power supply docking station of claim 9, the housing further comprising an auxiliary power connector configured to connect to an external DC power source.

11. The power supply docking station of claim 10, the auxiliary power connector disposed on a rear side of the housing.

12. The power supply docking station of claim 9, further comprising a substantially flat support platform configured to receive and support the radio.

13. The power supply docking station of claim 9, the battery compartment cover further comprising a latch actuatable to secure the battery compartment cover closed.

14. The power supply docking station of claim 13, further comprising hinges disposed on a rearward end of the battery compartment cover, the hinges rotatably connecting the battery compartment cover to the housing.

15. The power supply docking station of claim 9, wherein the at least two military standard batteries are BB-2590 batteries.

* * * * *